United States Patent
Danner

(10) Patent No.: US 10,527,880 B2
(45) Date of Patent: Jan. 7, 2020

(54) PROCESS FOR THE PRODUCTION OF ELECTRO-OPTIC DISPLAYS, AND COLOR FILTERS FOR USE THEREIN

(71) Applicant: E Ink Corporation, Billerica, MA (US)

(72) Inventor: Guy M. Danner, Somerville, MA (US)

(73) Assignee: E Ink Corporation, Billerica, MA (US)

( * ) Notice: Subject to any disclaimer, the term of this patent is extended or adjusted under 35 U.S.C. 154(b) by 365 days.

(21) Appl. No.: 15/360,207

(22) Filed: Nov. 23, 2016

(65) Prior Publication Data

US 2017/0075168 A1    Mar. 16, 2017

Related U.S. Application Data

(60) Continuation of application No. 14/926,574, filed on Oct. 29, 2015, now abandoned, which is a division of application No. 12/163,068, filed on Jun. 27, 2008, now Pat. No. 9,199,441.

(Continued)

(51) Int. Cl.
    *G02F 1/153* (2006.01)
    *G02F 1/03* (2006.01)
    (Continued)

(52) U.S. Cl.
    CPC ......... *G02F 1/133516* (2013.01); *B05D 3/06* (2013.01); *B32B 37/24* (2013.01);
    (Continued)

(58) Field of Classification Search
    CPC . G02F 1/167; G02F 1/03; G02F 1/133; G02F 1/061; G02F 2001/1678;
    (Continued)

(56) References Cited

U.S. PATENT DOCUMENTS

| | | |
|---|---|---|
| 3,668,106 A | 6/1972 | Ota |
| 3,756,693 A | 9/1973 | Ota |

(Continued)

FOREIGN PATENT DOCUMENTS

| | | |
|---|---|---|
| EP | 1099207 | 5/2001 |
| EP | 1145072 | 10/2001 |

(Continued)

OTHER PUBLICATIONS

Wood, D., "An Electrochromic Renaissance?" Information Display, 18(3), 24 (Mar. 2002) Mar. 1, 2002.

(Continued)

*Primary Examiner* — Dawayne Pinkney
(74) *Attorney, Agent, or Firm* — Brian D. Bean

(57) ABSTRACT

Processes are provided for depositing multiple color filter materials on a substrate to form color filters. In a first process, the surface characteristic of a substrate is modified by radiation so that a flowable form of a first color filter material will be deposited on a first area, and converted to a non-flowable form. A second color filter material can then be deposited on a second area of the substrate. In a second process, first and second color filter materials are deposited on separate donor sheets and transferred by radiation to separate areas of the substrate. A third process uses flexographic printing to transfer the first and second color filter materials to the substrate.

4 Claims, 6 Drawing Sheets

Related U.S. Application Data

(60) Provisional application No. 60/946,863, filed on Jun. 28, 2007.

(51) Int. Cl.

| | | |
|---|---|---|
| *G02F 1/15* | (2019.01) | |
| *G02B 26/00* | (2006.01) | |
| *G03G 17/04* | (2006.01) | |
| *G09G 3/19* | (2006.01) | |
| *G09G 3/38* | (2006.01) | |
| *G02F 1/133* | (2006.01) | |
| *G02F 1/1335* | (2006.01) | |
| *G03F 7/00* | (2006.01) | |
| *G02F 1/167* | (2019.01) | |
| *B32B 37/24* | (2006.01) | |
| *G02B 5/20* | (2006.01) | |
| *B05D 3/06* | (2006.01) | |
| *G02F 1/157* | (2006.01) | |
| *B32B 37/00* | (2006.01) | |
| *B32B 38/00* | (2006.01) | |

(52) U.S. Cl.
CPC ............ *G02B 5/201* (2013.01); *G02F 1/157* (2013.01); *G02F 1/167* (2013.01); *G03F 7/0007* (2013.01); *B32B 37/0053* (2013.01); *B32B 37/025* (2013.01); *B32B 2037/243* (2013.01); *B32B 2038/0076* (2013.01); *B32B 2310/0843* (2013.01); *B32B 2457/202* (2013.01); *G02F 2001/133519* (2013.01); *Y10T 428/24802* (2015.01)

(58) Field of Classification Search
CPC ........ G02B 26/00; G02B 26/08; G02B 26/26; G02B 5/201; G03C 1/732; G03C 1/73; G03C 1/675
USPC ........ 359/296, 265–277, 245–247, 254, 242; 430/31–32, 7, 332–334, 336, 338; 345/49, 105, 107; 349/33; 250/70; 438/929
See application file for complete search history.

(56) References Cited

U.S. PATENT DOCUMENTS

| | | |
|---|---|---|
| 3,767,392 A | 10/1973 | Ota |
| 3,792,308 A | 2/1974 | Ota |
| 3,870,517 A | 3/1975 | Ota et al. |
| 3,885,964 A | 5/1975 | Nacci |
| 3,892,568 A | 7/1975 | Ota |
| 4,418,346 A | 11/1983 | Batchelder |
| 4,828,617 A | 5/1989 | Csillag et al. |
| 5,582,703 A | 12/1996 | Sluzky et al. |
| 5,679,821 A | 10/1997 | Takei et al. |
| 5,695,346 A | 12/1997 | Sekiguchi |
| 5,745,094 A | 4/1998 | Gordon, II et al. |
| 5,760,761 A | 6/1998 | Sheridon |
| 5,777,782 A | 7/1998 | Sheridon |
| 5,789,487 A | 8/1998 | Matyjaszewski et al. |
| 5,808,783 A | 9/1998 | Crowley |
| 5,872,552 A | 2/1999 | Gordon, II |
| 5,912,283 A | 6/1999 | Hashizume et al. |
| 5,930,026 A | 7/1999 | Jacobson |
| 5,961,804 A | 10/1999 | Jacobson |
| 5,975,680 A | 11/1999 | Kodak |
| 6,017,584 A | 1/2000 | Albert |
| 6,054,071 A | 4/2000 | Mikkelsen, Jr. |
| 6,055,091 A | 4/2000 | Sheridon |
| 6,067,185 A | 5/2000 | Albert |
| 6,097,531 A | 8/2000 | Sheridon |
| 6,118,426 A | 9/2000 | Albert |
| 6,120,588 A | 9/2000 | Jacobson |
| 6,120,839 A | 9/2000 | Comiskey |
| 6,124,851 A | 9/2000 | Jacobson |
| 6,128,124 A | 10/2000 | Silverman |
| 6,130,773 A | 10/2000 | Jacobson |
| 6,130,774 A | 10/2000 | Albert |
| 6,137,467 A | 10/2000 | Sheridon |
| 6,144,361 A | 11/2000 | Gordon, II |
| 6,147,791 A | 11/2000 | Sheridon |
| 6,153,075 A | 11/2000 | Nemelka |
| 6,166,711 A | 12/2000 | Odake |
| 6,172,798 B1 | 1/2001 | Albert |
| 6,177,921 B1 | 1/2001 | Comiskey |
| 6,184,856 B1 | 2/2001 | Gordon, II |
| 6,225,971 B1 | 5/2001 | Gordon, II |
| 6,232,950 B1 | 5/2001 | Albert |
| 6,241,921 B1 | 6/2001 | Jacobson |
| 6,249,271 B1 | 6/2001 | Albert |
| 6,252,564 B1 | 6/2001 | Albert |
| 6,262,706 B1 | 7/2001 | Albert |
| 6,262,833 B1 | 7/2001 | Loxley |
| 6,271,823 B1 | 8/2001 | Gordon, II |
| 6,300,932 B1 | 10/2001 | Albert |
| 6,301,038 B1 | 10/2001 | Fitzmaurice |
| 6,312,304 B1 | 11/2001 | Duthaler |
| 6,312,971 B1 | 11/2001 | Amundson |
| 6,323,989 B1 | 11/2001 | Jacobson |
| 6,327,072 B1 | 12/2001 | Comiskey |
| 6,376,828 B1 | 4/2002 | Comiskey |
| 6,377,387 B1 | 4/2002 | Duthaler |
| 6,392,785 B1 | 5/2002 | Albert |
| 6,392,786 B1 | 5/2002 | Albert |
| 6,399,257 B1 | 6/2002 | Shirota et al. |
| 6,413,790 B1 | 7/2002 | Duthaler |
| 6,422,687 B1 | 7/2002 | Jacobson |
| 6,445,374 B2 | 9/2002 | Albert |
| 6,445,489 B1 | 9/2002 | Jacobson |
| 6,459,418 B1 | 10/2002 | Comiskey |
| 6,473,072 B1 | 10/2002 | Comiskey |
| 6,480,182 B2 | 11/2002 | Turner |
| 6,498,114 B1 | 12/2002 | Amundson |
| 6,504,524 B1 | 1/2003 | Gates |
| 6,506,438 B2 | 1/2003 | Duthaler |
| 6,512,354 B2 | 1/2003 | Jacobson |
| 6,515,649 B1 | 2/2003 | Albert |
| 6,518,949 B2 | 2/2003 | Drzaic |
| 6,521,489 B2 | 2/2003 | Duthaler et al. |
| 6,531,997 B1 | 3/2003 | Gates |
| 6,535,197 B1 | 3/2003 | Comiskey |
| 6,538,801 B2 | 3/2003 | Jacobson |
| 6,545,291 B1 | 4/2003 | Amundson |
| 6,580,545 B2 | 6/2003 | Morrison |
| 6,606,137 B2 | 8/2003 | Lee |
| 6,628,258 B1 | 9/2003 | Nakamura |
| 6,639,578 B1 | 10/2003 | Comiskey |
| 6,652,075 B2 | 11/2003 | Jacobson |
| 6,657,772 B2 | 12/2003 | Loxley |
| 6,664,944 B1 | 12/2003 | Albert |
| D485,294 S | 1/2004 | Albert |
| 6,672,921 B1 | 1/2004 | Liang |
| 6,680,725 B1 | 1/2004 | Jacobson |
| 6,680,726 B2 | 1/2004 | Gordon, II |
| 6,683,333 B2 | 1/2004 | Kazlas |
| 6,693,620 B1 | 2/2004 | Herb |
| 6,704,133 B2 | 3/2004 | Gates |
| 6,710,540 B1 | 3/2004 | Albert |
| 6,717,716 B2 | 4/2004 | Kawai |
| 6,721,083 B2 | 4/2004 | Jacobson |
| 6,724,519 B1 | 4/2004 | Comiskey |
| 6,727,881 B1 | 4/2004 | Albert |
| 6,738,050 B2 | 5/2004 | Comiskey |
| 6,750,473 B2 | 6/2004 | Amundson |
| 6,753,999 B2 | 6/2004 | Zehner |
| 6,788,449 B2 | 9/2004 | Liang |
| 6,815,125 B1 | 11/2004 | Okabe et al. |
| 6,816,147 B2 | 11/2004 | Albert |
| 6,819,471 B2 | 11/2004 | Amundson |
| 6,822,782 B2 | 11/2004 | Honeyman |
| 6,825,068 B2 | 11/2004 | Denis |
| 6,825,829 B1 | 11/2004 | Albert |

(56) References Cited

U.S. PATENT DOCUMENTS

| | | |
|---|---|---|
| 6,825,970 B2 | 11/2004 | Goenaga |
| 6,830,856 B2 | 12/2004 | Tsai et al. |
| 6,831,769 B2 | 12/2004 | Holman |
| 6,839,158 B2 | 1/2005 | Albert |
| 6,842,167 B2 | 1/2005 | Albert |
| 6,842,279 B2 | 1/2005 | Amundson |
| 6,842,657 B1 | 1/2005 | Drzaic |
| 6,864,875 B2 | 3/2005 | Drzaic |
| 6,865,010 B2 | 3/2005 | Duthaler et al. |
| 6,866,760 B2 | 3/2005 | Paolini, Jr. |
| 6,870,657 B1 | 3/2005 | Fitzmaurice |
| 6,870,661 B2 | 3/2005 | Pullen et al. |
| 6,900,851 B2 | 5/2005 | Morrison |
| 6,922,276 B2 | 7/2005 | Zhang et al. |
| 6,950,220 B2 | 9/2005 | Abramson et al. |
| 6,958,848 B2 | 10/2005 | Cao et al. |
| 6,967,640 B2 | 11/2005 | Albert et al. |
| 6,980,196 B1 | 12/2005 | Turner et al. |
| 6,982,178 B2 | 1/2006 | LeCain et al. |
| 6,987,603 B2 | 1/2006 | Paolini, Jr. et al. |
| 6,995,550 B2 | 2/2006 | Jacobson |
| 7,002,728 B2 | 2/2006 | Pullen et al. |
| 7,012,600 B2 | 3/2006 | Zehner |
| 7,012,735 B2 | 3/2006 | Honeyman et al. |
| 7,023,420 B2 | 4/2006 | Comiskey et al. |
| 7,030,412 B1 | 4/2006 | Drzaic et al. |
| 7,030,854 B2 | 4/2006 | Baucom et al. |
| 7,034,783 B2 | 4/2006 | Gates |
| 7,038,655 B2 | 5/2006 | Herb |
| 7,061,663 B2 | 6/2006 | Cao et al. |
| 7,071,913 B2 | 7/2006 | Albert |
| 7,075,502 B1 | 7/2006 | Drzaic |
| 7,075,703 B2 | 7/2006 | O'Neil et al. |
| 7,079,305 B2 | 7/2006 | Paolini, Jr. et al. |
| 7,106,296 B1 | 9/2006 | Jacobson |
| 7,109,968 B2 | 9/2006 | Albert et al. |
| 7,110,163 B2 | 9/2006 | Webber et al. |
| 7,110,164 B2 | 9/2006 | Paolini, Jr. et al. |
| 7,116,318 B2 | 10/2006 | Amundson et al. |
| 7,116,466 B2 | 10/2006 | Whitesides et al. |
| 7,119,759 B2 | 10/2006 | Zehner et al. |
| 7,119,772 B2 | 10/2006 | Amundson |
| 7,148,128 B2 | 12/2006 | Jacobson |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,180,649 B2 | 2/2007 | Morrison et al. |
| 7,190,008 B2 | 3/2007 | Amundson et al. |
| 7,193,625 B2 | 3/2007 | Danner et al. |
| 7,202,847 B2 | 4/2007 | Gates |
| 7,202,991 B2 | 4/2007 | Zhang et al. |
| 7,206,119 B2 | 4/2007 | Honeyman et al. |
| 7,223,672 B2 | 5/2007 | Kazlas et al. |
| 7,230,750 B2 | 6/2007 | Whitesides |
| 7,230,751 B2 | 6/2007 | Whitesides et al. |
| 7,236,290 B1 | 6/2007 | Zhang et al. |
| 7,236,291 B2 | 6/2007 | Kaga et al. |
| 7,236,292 B2 | 6/2007 | LeCain |
| 7,242,513 B2 | 7/2007 | Albert et al. |
| 7,247,379 B2 | 7/2007 | Pullen et al. |
| 7,256,766 B2 | 8/2007 | Albert et al. |
| 7,258,955 B2 | 8/2007 | Kishimoto et al. |
| 7,259,744 B2 | 8/2007 | Arango |
| 7,265,895 B2 | 9/2007 | Miyazaki et al. |
| 7,280,094 B2 | 10/2007 | Albert |
| 7,304,634 B2 | 12/2007 | Albert et al. |
| 7,304,787 B2 | 12/2007 | Whitesides et al. |
| 7,312,784 B2 | 12/2007 | Baucom et al. |
| 7,312,794 B2 | 12/2007 | Zehner |
| 7,312,916 B2 | 12/2007 | Pullen |
| 7,321,459 B2 | 1/2008 | Masuda et al. |
| 7,327,511 B2 | 2/2008 | Whitesides et al. |
| 7,339,715 B2 | 3/2008 | Webber et al. |
| 7,349,148 B2 | 3/2008 | Doshi et al. |
| 7,352,353 B2 | 4/2008 | Albert |
| 7,359,109 B2 | 4/2008 | Daniel et al. |
| 7,365,394 B2 | 4/2008 | Denis et al. |
| 7,365,733 B2 | 4/2008 | Duthaler |
| 7,369,299 B2 | 5/2008 | Sakurai et al. |
| 7,375,875 B2 | 5/2008 | Whitesides |
| 7,382,363 B2 | 6/2008 | Albert et al. |
| 7,388,572 B2 | 6/2008 | Duthaler et al. |
| 7,391,555 B2 | 6/2008 | Albert et al. |
| 7,477,444 B2 | 1/2009 | Cao et al. |
| 7,554,712 B2 | 6/2009 | Patry et al. |
| 7,612,760 B2 | 11/2009 | Kawai |
| 7,705,823 B2 | 4/2010 | Nihei |
| 7,729,039 B2 | 6/2010 | LeCain et al. |
| 7,927,771 B2 | 4/2011 | Kim et al. |
| 8,174,490 B2 | 5/2012 | Whitesides |
| 8,289,250 B2 | 10/2012 | Zehner |
| 8,300,006 B2 | 10/2012 | Zhou |
| 8,384,658 B2 | 2/2013 | Albert |
| 8,466,852 B2 | 6/2013 | Drzaic |
| 8,558,783 B2 | 10/2013 | Wilcox |
| 8,610,988 B2 | 12/2013 | Zehner et al. |
| 8,928,562 B2 | 1/2015 | Gates et al. |
| 2002/0060321 A1 | 5/2002 | Kazlas |
| 2002/0090980 A1 | 7/2002 | Wilcox et al. |
| 2002/0113871 A1 | 8/2002 | Sakamaki et al. |
| 2002/0151246 A1 | 10/2002 | Ikeda et al. |
| 2003/0102858 A1 | 6/2003 | Jacobson et al. |
| 2004/0105036 A1 | 6/2004 | Danner et al. |
| 2004/0119681 A1 | 6/2004 | Albert et al. |
| 2004/0130253 A1* | 7/2004 | Ohsaki ............... G02B 5/201 313/110 |
| 2005/0012980 A1 | 1/2005 | Wilcox et al. |
| 2005/0122306 A1 | 6/2005 | Wilcox et al. |
| 2005/0122563 A1 | 6/2005 | Honeyman et al. |
| 2005/0156340 A1 | 7/2005 | Valianatos et al. |
| 2005/0157157 A1* | 7/2005 | Tsukamoto ............ B41M 5/265 347/213 |
| 2005/0253777 A1 | 11/2005 | Zehner et al. |
| 2005/0259068 A1 | 11/2005 | Nihei et al. |
| 2006/0007194 A1 | 1/2006 | Verschueren et al. |
| 2006/0087479 A1 | 4/2006 | Sakurai et al. |
| 2006/0087489 A1 | 4/2006 | Sakurai et al. |
| 2006/0087718 A1 | 4/2006 | Takagi et al. |
| 2006/0209008 A1 | 9/2006 | Nihei et al. |
| 2006/0214906 A1 | 9/2006 | Kobayashi et al. |
| 2006/0231401 A1 | 10/2006 | Sakurai et al. |
| 2007/0052757 A1 | 3/2007 | Jacobson |
| 2007/0091417 A1 | 4/2007 | Cao et al. |
| 2007/0091418 A1 | 4/2007 | Danner et al. |
| 2007/0103427 A1 | 5/2007 | Zhou |
| 2007/0195399 A1 | 8/2007 | Aylward |
| 2007/0285385 A1 | 12/2007 | Albert |
| 2008/0024429 A1 | 1/2008 | Zehner |
| 2008/0024482 A1 | 1/2008 | Gates |
| 2008/0043318 A1 | 2/2008 | Whitesides |
| 2008/0048970 A1 | 2/2008 | Drzaic |
| 2008/0130092 A1 | 6/2008 | Whitesides |
| 2008/0136774 A1 | 6/2008 | Harris |

FOREIGN PATENT DOCUMENTS

| | | |
|---|---|---|
| JP | 2000028820 | 1/2000 |
| JP | 2000322002 | 11/2000 |
| JP | 2001264824 | 9/2001 |
| JP | 2001265262 | 9/2001 |
| WO | 2000036560 | 6/2000 |
| WO | 2000038000 | 6/2000 |
| WO | 2000067110 | 11/2000 |
| WO | 2001007961 | 2/2001 |
| WO | 2004099862 | 1/2005 |
| WO | 2011146920 | 2/2012 |

OTHER PUBLICATIONS

O'Regan, B. et al., "A Low Cost, High-efficiency Solar Cell Based on Dye-sensitized colloidal TiO2 Films", Nature, vol. 353, Oct. 24, 1991, 737-740 Oct. 24, 1991.

(56) References Cited

OTHER PUBLICATIONS

Bach, U., et al., "Nanomaterials-Based Electrochromics for Paper-Quality Displays", Adv. Mater, 14(11), 845 (2002) Jun. 5, 2002.

Kitamura, T., et al., "Electrical toner movement for electronic paper-like display", Asia Display/IDW '01, p. 1517, Paper HCS1-1 (2001) Dec. 31, 2001.

Yamaguchi, Y., et al., "Toner display using insulative particles charged triboelectrically", Asia Display/IDW '01, p. 1729, Paper AMD4-4 (2001) Dec. 31, 2001.

Chen, Y., et al., "A Conformable Electronic Ink Display using a Foil-Based a-Si TFT Array", SID 01 Digest, 157 (Jun. 2001) Jun. 30, 2001.

Comiskey, B., et al., "An electrophoretic ink for all-printed reflective electronic displays", Nature, 394, 253 (1998) Dec. 31, 1998.

Comiskey, B., et al., "Electrophoretic Ink: A Printable Display Material", SID 97 Digest (1997), p. 75 Dec. 31, 1997.

Drzaic, P., et al., "A Printed and Rollable Bistable Electronic Display", SID 98 Digest (1998), p. 1131 Dec. 31, 1998.

Duthaler, G., et al., "Active-Matrix Color Displays Using Electrophoretic Ink and Color Filters", SID 02 Digest, 1374 (2002) Dec. 31, 2002.

Jacobson, J., et al., "The last book", IBM Systems J., 36, 457 (1997) Dec. 31, 1997.

Jo, G-R, et al., "Toner Display Based on Particle Movements", Chem. Mater, 14, 664 (2002) Dec. 31, 2002.

Kazlas, P., et al., "12.1" SVGA Microencapsulated Electrophoretic Active Matrix Display for Information Applicances", SID 01 Digest, 152 (Jun. 2001) Jun. 30, 2001.

Pitt, M.G., et al., "Power Consumption of Microencapsulated Electrophoretic Displays for Smart Handheld Applications", SID 02 Digest, 1378 (2002) Dec. 31, 2002.

Webber, R., "Image Stability in Active-Matrix Microencapsulated Electrophoretic Displays", SID 02 Digest, 126 (2002) Dec. 31, 2002.

Zehner, R. et al., "Drive Waveforms for Active Matrix Electrophoretic Displays", SID 03 Digest, 842 (2003) Dec. 31, 2003.

Amundson, K., et al., "12.3: Flexible, Active-Matrix Display Constructed Using a Microencapsulated Electrophoretic Material and an Organic-Semiconductor-Based Backplane", SID 01 Digest, 160 (Jun. 2001) Jun. 30, 2001.

Au, J. et al., "Ultra-Thin 3.1-in. Active-Matrix Electronic Ink Display for Mobile Devices", IDW'02, 223 (2002) Dec. 31, 2002.

Bouchard, A. et al., "High-Resolution Microencapsulated Electrophoretic Display on Silicon", SID 04 Digest, 651 (2004) Dec. 31, 2004.

Caillot, E. et al. "Active Matrix Electrophoretic Information Display for High Performance Mobile Devices", IDMC Proceedings (2003) Dec. 31, 2003.

Danner, G.M. et al., "Reliability Performance for Microencapsulated Electrophoretic Displays with Simulated Active Matrix Drive", SID 03 Digest, 573 (2003) Dec. 31, 2003.

Henzen, A. et al., "An Electronic Ink Low Latency Drawing Tablet", SID 04 Digest, 1070 (2004) Dec. 31, 2004.

Henzen, A. et al., "Development of Active Matrix Electronic Ink Displays for Handheld Devices", SID 03 Digest, 176, (2003) Dec. 31, 2003.

Henzen, A. et al., "Development of Active Matrix Electronic Ink Displays for Smart Handheld Applications", IDW'02, 227 (2002) Dec. 31, 2002.

Kazlas, P. et al., "Card-size Active-matrix Electronic Ink Display", Eurodisplay 2002, 259 (2002) Dec. 31, 2002.

Whitesides, T. et al., "Towards Video-rate Microencapsulated Dual-Particle Electrophoretic Displays", SID 04 Digest, 133 (2004) Dec. 31, 2004.

Amundson, K., "Electrophoretic Imaging Films for Electronic Paper Displays" in Crawford, G. ed. Flexible Flat Panel Displays, John Wiley & Sons, Ltd., Hoboken, NJ (2005) Dec. 31, 2005.

Bocarsley, A. et al., "Photonic Electrochemistry" in Laboratory Techniques in Electroanalytical Chemistry, 2nd edition, eds. Kissinger, P.T. and Heineman, W.R., Marcel Dekker, pp. 855-898, New York (1996) Dec. 31, 1996.

Danner, G. M. et al., "Display Performance for Mobile Device Applications", IDW'01 (2001) Dec. 31, 2001.

Duthaler, G. et al., "Paper-like Color Displays Using Electrophoretic Ink and Color Filers", IDW'01 (2001) Dec. 31, 2001.

Gates, H. et al. "A5 Sized Electronic Paper Display for Document Viewing", SID 05 Digest (2005) Dec. 31, 2005.

Hayward, R.C.; Saville, D.A.; Aksay, I.A. "Electrophoretic assembly of colloidal crystals with optically tunable micropatterns", Natures, 404, 56-59 (2000) Dec. 31, 2000.

Johnson, M. et al., "High Quality Images on Electronic Paper Displays", SID 05 Digest, 1666 (2005) Dec. 31, 2005.

Morrison, Ian D., et al., "Toward Self-Consistent Characterization of Low Conductivity Dispersions", Langmuir, vol. 7, No. 10 (1991) Dec. 31, 1991.

Napper, D.H., "Polymeric Stabilization of Collodial Dispersions", Academic Press: London (1983) Dec. 31, 1983.

* cited by examiner

PROCESS FOR THE PRODUCTION OF ELECTRO-OPTIC DISPLAYS, AND COLOR FILTERS FOR USE THEREIN

RELATED APPLICATIONS

This application is continuation of Ser. No. 14/926,574 filed on Oct. 29, 2015, which is a divisional of U.S. application Ser. No. 12/163,068, filed Jun. 27, 2008, which claims the benefit of U.S. application Ser. No. 60/946,863, filed Jun. 28, 2007. This application is also related to (a) U.S. Pat. No. 7,667,684; and (b) U.S. Pat. No. 7,339,715.

The entire contents of the co-pending application and patents, and of all other U.S. patents and published and copending applications mentioned below, are herein incorporated by reference.

BACKGROUND OF INVENTION

This invention relates to processes for the production of electro-optic displays and for filters for use in such displays.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Patent Publication Nos. 2005/0259068, 2006/0087479, 2006/0087489, 2006/0087718, 2006/0209008, 2006/0214906, 2006/0231401, 2006/0238488, 2006/0263927 and U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspending medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413, 790; 6,422,687; 6,445,374; 6,445,489; 6,459,418; 6,473, 072; 6,480,182; 6,498,114; 6,504,524; 6,506,438; 6,512, 354; 6,515,649; 6,518,949; 6,521,489; 6,531,997; 6,535, 197; 6,538,801; 6,545,291; 6,580,545; 6,639,578; 6,652, 075; 6,657,772; 6,664,944; 6,680,725; 6,683,333; 6,704, 133; 6,710,540; 6,721,083; 6,724,519; 6,727,881; 6,738, 050; 6,750,473; 6,753,999; 6,816,147; 6,819,471; 6,822, 782; 6,825,068; 6,825,829; 6,825,970; 6,831,769; 6,839, 158; 6,842,167; 6,842,279; 6,842,657; 6,864,875; 6,865, 010; 6,866,760; 6,870,661; 6,900,851; 6,922,276; 6,950, 200; 6,958,848; 6,967,640; 6,982,178; 6,987,603; 6,995, 550; 7,002,728; 7,012,600; 7,012,735; 7,023,420; 7,030, 412; 7,030,854; 7,034,783; 7,038,655; 7,061,663; 7,071, 913; 7,075,502; 7,075,703; 7,079,305; 7,106,296; 7,109, 968; 7,110,163; 7,110,164; 7,116,318; 7,116,466; 7,119,759; 7,119,772; 7,148,128; 7,167,155; 7,170,670; 7,173,752; 7,176,880; 7,180,649; 7,190,008; 7,193,625; 7,202,847; 7,202,991; 7,206,119; 7,223,672; 7,230,750; 7,230,751; 7,236,790; 7,236,792; 7,242,513; 7,247,379; 7,256,766; 7,259,744; 7,280,094; 7,304,634; 7,304,787; 7,312,784; 7,312,794; 7,312,916; 7,237,511; 7,339,715; 7,349,148; 7,352,353; 7,365,394; and 7,365,733; and U.S. Patent Applications Publication Nos. 2002/0060321; 2002/0090980; 2003/0102858; 2003/0151702; 2003/0222315; 2004/ 0105036; 2004/0112750; 2004/0119681; 2004/0155857; 2004/0180476; 2004/0190114; 2004/0257635; 2004/ 0263947; 2005/0000813; 2005/0007336; 2005/0012980; 2005/0018273; 2005/0024353; 2005/0062714; 2005/ 0099672; 2005/0122284; 2005/0122306; 2005/0122563; 2005/0134554; 2005/0151709; 2005/0152018; 2005/ 0156340; 2005/0179642; 2005/0190137; 2005/0212747; 2005/0253777; 2005/0280626; 2006/0007527; 2006/ 0038772; 2006/0139308; 2006/0139310; 2006/0139311; 2006/0176267; 2006/0181492; 2006/0181504; 2006/ 0194619; 2006/0197737; 2006/0197738; 2006/0202949; 2006/0223282; 2006/0232531; 2006/0245038; 2006/ 0262060; 2006/0279527; 2006/0291034; 2007/0035532; 2007/0035808; 2007/0052757; 2007/0057908; 2007/ 0069247; 2007/0085818; 2007/0091417; 2007/0091418; 2007/0109219; 2007/0128352; 2007/0146310; 2007/ 0152956; 2007/0153361; 2007/0200795; 2007/0200874; 2007/0201124; 2007/0207560; 2007/0211002; 2007/ 0211331; 2007/0223079; 2007/0247697; 2007/0285385; 2007/0286975; 2007/0286975; 2008/0013155; 2008/ 0013156; 2008/0023332; 2008/0024429; 2008/0024482; 2008/0030832; 2008/0043318; 2008/0048969; 2008/ 0048970; 2008/0054879; 2008/0057252; and 2008/ 0074730; and International Applications Publication Nos. WO 00/38000; WO 00/36560; WO 00/67110; and WO 01/07961; and European Patents Nos. 1,099,207 B1; and 1,145,072 B1.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, the aforementioned U.S. Pat. Nos. 6,130,774 and 6,172,798, and U.S. Pat. Nos. 5,872,552; 6,144,361; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic media may also be useful in the present invention.

Many types of electro-optic media are essentially monochrome, in the sense that any given medium has two extreme optical states and a range of gray levels lying between the two extreme optical states. As already indicated, the two extreme optical states need not be black and white. For example, one extreme optical state can be white and the other dark blue, so that the intermediate gray levels will be varying shades of blue, or one extreme optical state can be red and the other blue, so that the intermediate gray levels will be varying shades of purple.

There is today an increasing demand for full color displays, even for small, portable displays; for example, most displays on cellular telephones are today full color. To provide a full color display using monochrome media, it is either necessary to place a color filter array where the display can be viewed through the color filter array, or to place areas of different electro-optic media capable of displaying different colors adjacent one another.

FIG. 1 of the accompanying drawings is a schematic section through a color electrophoretic display (generally designated 100) comprising a backplane 102 bearing a plurality of pixel electrodes 104. To this backplane 102 has been laminated an inverted front plane laminate as described in the aforementioned 2007/0109219, this inverted front plane laminate comprising a monochrome electrophoretic medium layer 106 having black and white extreme optical states, an adhesive layer 108, a color filter array 110 having red, green and blue areas aligned with the pixel electrodes 104, a substantially transparent conductive layer 112 (typically formed from indium-tin-oxide, no) and a front protective layer 114.

In the display 100, the electrophoretic layer 106 is of course not 100 percent reflective, and the saturation of the color filter elements in the array 110 must be reduced to allow enough light to pass through the array 110, reflect from the electrophoretic layer 106, and return through the array 110. However, using a color filter array does enable a single black/white electro-optic medium to provide a full color display, and it is typically easier to control the color gamut of a display by varying the colors in a color filter array than by varying the colors of electro-optic media, there being far more materials available for use in color filter arrays than in most electro-optic media.

Forming a color filter array such as the array 110 shown in FIG. 1 is not easy, especially in high resolution displays having resolutions of (say) 100 lines per inch (4 lines per mm) or more, since if such arrays are formed using red, green and blue lines, the individual colored lines will be only about 1/300 inch (about 80 µm) wide. Forming such fine colored lines using conventional printing techniques is difficult, especially since many printing techniques allow the printed material to spread laterally after printing. In a color filter array, it is highly desirable that the colored lines touch but do not overlap, since any gaps between adjacent lines will produce in effect an unanticipated white area in the color filter array and will result in a (typically non-uniform) decrease in color saturation, whereas any overlap will cause color distortion in the final display.

Accordingly, there is a need for improved processes for forming color filter arrays in which differently colored areas touch but do not overlap, and this invention seeks to provide such improved processes.

A further difficulty in color filter arrays is aligning such arrays with the sub-pixel electrodes of the display's backplane. In most prior art methods for manufacturing color filter arrays, the color filter array is manufactured as a separate integer, which may be laminated to a monochrome display, or an electro-optic medium may be coated over the color filter array and the resultant sub-assembly laminated to a backplane. Especially in high resolution displays, maintaining the necessary alignment between the color filter array and the sub-pixel electrodes is difficult, and this problem becomes especially acute in thin, flexible electro-optic displays. It would be advantageous if color filter arrays could be formed in alignment with sub-pixel electrodes, and preferred processes of the present invention can form such aligned color filter arrays.

SUMMARY OF THE INVENTION

In a first aspect, this invention provides a process for depositing first and second color filter materials on a substrate, the process comprising:
  depositing on the substrate a coating of a material having a surface characteristic capable of being modified by radiation;
  applying radiation to a first area of the coating but not to a second area thereof;
  depositing a flowable form of the first color filter material on to the first area of the coating;
  converting the flowable form of the first color filter material on the first area of the coating to a non-flowable form;
  applying radiation to the second area of the coating; and
  depositing the second color filter material on to the second area of the coating.

This first process of the present invention may hereinafter for convenience be called the "surface modification process" or "SM process" of the invention.

In a second aspect, this invention provides a process for depositing first and second color filter materials on a substrate, the process comprising:
  depositing the first color filter material on a first donor sheet, the first donor sheet absorbing radiation such that exposure of a first area of the first donor sheet to the radiation will cause the first color filter material overlying the first area to become detached from the first donor sheet;
  depositing the second color filter material on a second donor sheet, the second donor sheet absorbing radiation such that exposure of a second area of the second donor sheet to the radiation will cause the second color filter material overlying the second area to become detached from the second donor sheet;
  bringing the first donor sheet adjacent the substrate with the first color filter material facing the substrate, and applying radiation to the first area of the first donor sheet, thereby causing the first area of the first color filter material to become detached from the first donor sheet and deposited on a first area of the substrate; and
  bringing the second donor sheet adjacent the substrate with the second color filter material facing the substrate, and applying radiation to the second area of the second donor sheet, thereby causing the second area of the second color filter material to become detached from the second donor sheet and deposited on a second area of the substrate.

This second process of the present invention may hereinafter for convenience be called the "donor sheet transfer process" or "DST process" of the invention.

In a third aspect, this invention provides a process for depositing first and second color filter materials on a substrate, the process comprising:
  providing the first color filter material in a liquid form;
  providing a first plate cylinder having at least one raised portion and at least one recessed portion;
  forming a layer of the liquid form of the first color filter material on the at least one raised portion of the plate cylinder but not on the at least one recessed portion thereof;
  transferring the liquid form of the first color filter material from the plate cylinder to a first area of the substrate;
  providing the second color filter material in a liquid form;
  providing a second plate cylinder having at least one raised portion and at least one recessed portion;
  forming a layer of the liquid form of the second color filter material on the at least one raised portion of the plate cylinder but not on the at least one recessed portion thereof; and
  transferring the liquid form of the second color filter material from the plate cylinder to a second area of the substrate.

This third process of the present invention may hereinafter for convenience be called the "flexographic process" of the invention.

The color filter materials used in the processes of the present invention may be any material useful in forming a color filter array suitable for use in an electro-optic display. Typically, the color filter material will be used in a form which has substantially the same color as the area of the color filter array derived from the color filter material; some minor change in color may of course occur during conversion of a flowable or liquid form of a color filter material to a solid state. However, the color filter materials may also be used in a precursor form which is essentially colorless but develops the necessary color after deposition on the substrate; for example, the color filter material may contain a thermally activated dye precursor which develops color when the color filter material is heated on the substrate to convert it to a solid form. In the case of the donor sheet transfer process, the precursor can be radiation-sensitive such that the radiation used to transfer the color filter material from the donor sheet to the substrate also converts the color precursor to its colored form. The color filter materials used in the present invention will typically have differing colors in the normal sense of that term, i.e., different absorption profiles in the visible range, but the present processes can also be used to provide "pseudo-color filter arrays" in the sense of arrays of materials having different absorption profiles in a non-visible range. If the color filter materials used do have different pseudo colors such that they are not readily distinguishable by eye, it may be convenient to provide them with different visible colors to facilitate inspection; the visible colors may or may not be fugitive in the sense of being removable, for example by exposure to heat or radiation, prior to use of the pseudo-color display.

The processes of the present invention may be carried out at various different stages in the construction of electro-optic displays. For example, provided the electro-optic medium used in the display is either light transmissive or operated in shutter mode, the substrate used in each process may be a backplane bearing at least first and second sets of electrodes, and the first and second color filter materials may be deposited aligned with the first and second sets of electrodes respectively. An electro-optic medium, front electrode and, typically, a protective layer can then be laminated over the color filter array to form a finished display. Alternatively and more commonly, the substrate used in each process may be a light-transmissive electrically-conductive layer, typically supported on a light-transmissive supporting layer; after deposition of the first and second color filter materials, the resultant supporting layer/electrode layer/color filter array sub-assembly may be coated with an electro-optic medium, and an adhesive layer and release sheet laminated over the electro-optic medium to form a front plane laminate as described in the aforementioned U.S. Pat. No. 6,982,178. In another variant of the present processes, the color filter material may be deposited on a substrate comprising a release sheet which may or may not previously have been coated with an adhesive layer. The resultant release sheet/color filter material or release sheet/adhesive layer/color filter material sub-assembly can then have the exposed surface of the color filter material laminated to an electro-optic medium to form a double release sheet as described in the aforementioned 2004/0155857. The release sheet/color filter material or release sheet/adhesive layer/color filter material sub-assembly could also be used to form an inverted from plane laminate as described in the aforementioned 2007/0109219.

This invention extends to the color filter arrays produced by the processes of the invention, and to electro-optic displays, front plane laminates, inverted front plane laminates and double release films produced from such color filter arrays. The displays of the present invention may be used in any application in which prior art electro-optic displays have been used. Thus, for example, the present displays may be used in electronic book readers, portable computers, tablet computers, cellular telephones, smart cards, signs, watches, shelf labels and flash drives.

All the accompanying drawings are schematic and not to scale. In particular, for ease of illustration, the thicknesses of the various layers in the drawings do not correspond to their actual thicknesses. Also, in all the drawings, the thicknesses of the various layers are greatly exaggerated relative to their lateral dimensions.

BRIEF DESCRIPTION OF THE DRAWINGS

As already mentioned, FIG. 1 of the accompanying drawings is a schematic section through a color electrophoretic display.

DETAILED DESCRIPTION

Figure 1:
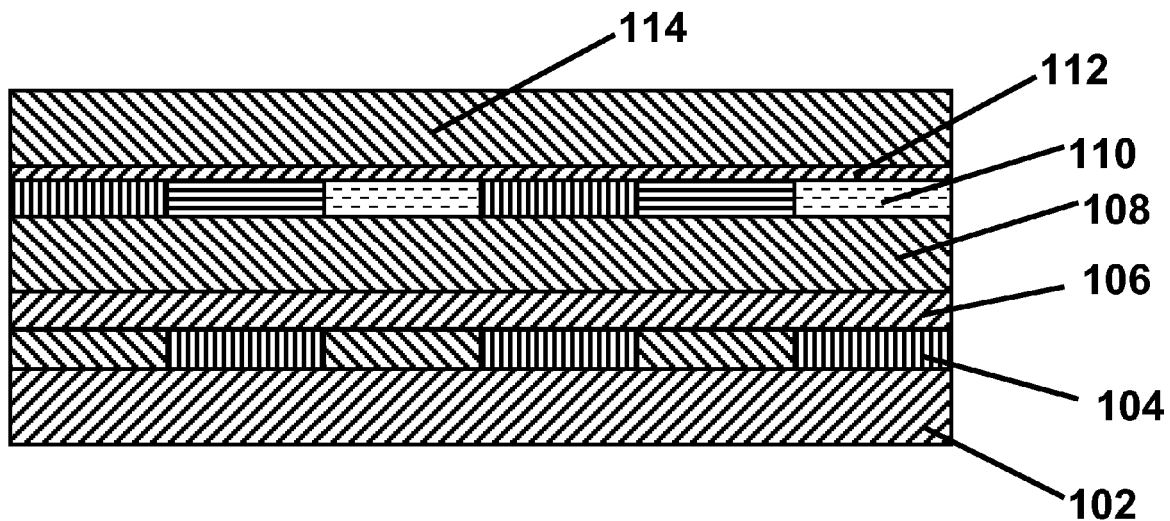

As already mentioned, the present invention provides three different processes for depositing multiple types of color filter materials on a substrate. These three processes will primarily be described separately below, but first consideration will be given to certain issues common to all of the processes.

The processes of the invention are of course restricted to color filter materials which can survive the process without loss of their color or color-developing ability, and (in some cases) which can be prepared in the necessary flowable or liquid forms. Similarly, a color filter material which cannot be formed into a substantially solid layer, which can be ruptured as required to enable portions of the layer to be transferred from a donor sheet to a substrate, is not suitable for use in the donor sheet transfer process of the present invention. Displays of the present invention may include electro-optic media of any of the types discussed above. For example, the electro-optic media may comprise a rotating bichromal member or electrochromic material, or an electrophoretic material comprising a plurality of electrically charged particles disposed in a fluid and capable of moving through the fluid under the influence of an electric field. The electrically charged particles and the fluid may be confined within a plurality of capsules or microcells, or may be present as a plurality of discrete droplets surrounded by a continuous phase comprising a polymeric material. The fluid may be liquid or gaseous.

As already mentioned, the surface modification process requires flowable forms of the color filter materials, while the flexographic process requires liquid forms and the donor sheet transfer process typically requires solid forms. For obvious reasons, the final form of the color filter materials in each process will normally be solid. Hence, the surface modification process and the flexographic process will normally be carried out with an uncured form of each color filter material which will be cured (a term used herein to cover solvent removal, polymerization and cross-linking, as well as other known procedures for solidifying liquids or semi-solids) to produce the color filter material. Although the donor sheet transfer process uses a solid form of each color filter material, this form need not be identical to that finally present on the substrate; for example, it may be advantageous to use a partially cured form of each color filter material on the donor sheet and then to complete the curing of the color filter material on the substrate to enhance the adhesion of the color filter material to the substrate. In some forms of the present invention, the substrate on to which the color filter materials are originally deposited may be only a temporary substrate (for example, the substrate could be a release sheet from which the color filter materials are transferred to the viewing surface of a pre-formed electro-optic display) and in such cases it may be desirable to postpone final curing of the color filter materials until they are transferred to their final substrate.

Although the processes of the present invention have been defined above as requiring only two different types of color filter materials, in practice the present processes will normally be used for creating full color displays, and hence the processes will typically be used with three or four (or even possibly more) different types of color filter materials. For example, the present processes can be used to create color filter arrays of the red/green/blue, red/green/blue/white, cyan/magenta/yellow and cyan/magenta/yellow/white types.

Electro-optic displays produced by the processes of the present invention can incorporate any of the optional features, such as barrier and protective layers, edge seals etc. described in the aforementioned E Ink and MIT patents and applications.

Section A: Surface Modification Process

Figure 2:
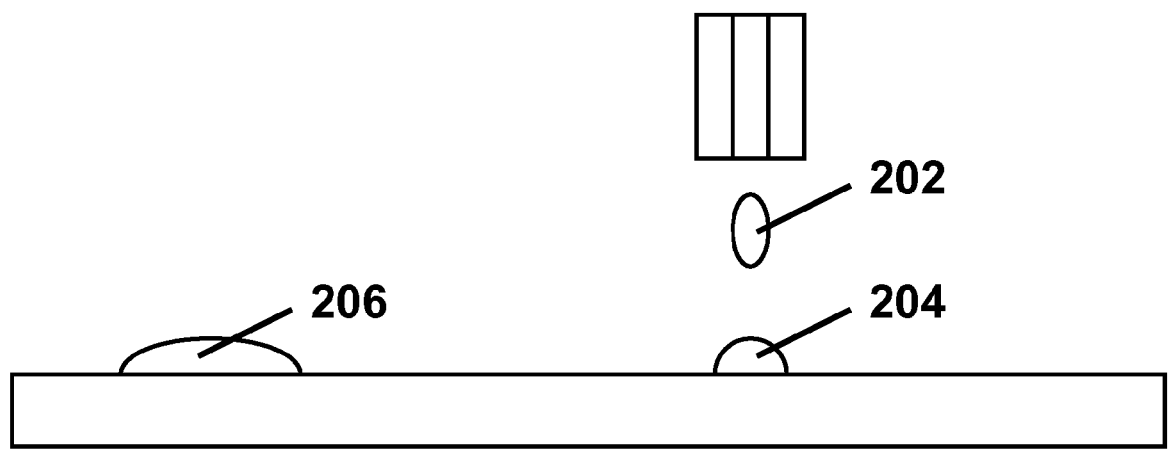
FIG. 2 is a schematic side elevation of a first surface modification process of the present invention in which deposition of the color filter material is effected by micro-pipetting.

In the surface modification process of the present invention, a coating of a material having a surface characteristic capable of being modified by radiation is used to control the spread of a flowable color filter material across a substrate. In order to create an array of regions of different color filter materials, one must be able to pattern small amounts of the materials very precisely. Dispensing small amounts of flowable materials can readily be accomplished; for example by micro-pipetting, as illustrated in FIG. 2 of the accompanying drawings. If a dispensed drop 202 does not wet the substrate on to which it is dispensed, the resultant drop 204 will be confined to a small area of the substrate. If, on the other hand, the dispensed drop does wet the substrate, as indicated at drop 206, the drop may cover a large area. Neither situation is ideal for forming a precise pattern of different color filter materials. The non-wetting drop 204 may fail to cover the full area of the sub-pixel which is intended to cover (with resultant loss of color saturation) while the wetting drop 206 may spread beyond the confines of a single sub-pixel, causing color inter-mixing. (The term "sub-pixel" is used herein in its conventional meaning in the imaging art to refer to the area occupied by a single color within a "pixel" which comprises a collection of at least one sub-pixel of each color. For example, in an RGB display each pixel comprises three sub-pixels having red, green and blue colors, whereas in an RGBW display each pixel comprises four sub-pixels.) By selectively modifying the surface energy of the substrate in accordance with the SM process of the present invention, the dispensed color filter material can be made to wet the whole desired sub-pixel area and not adjacent sub-pixel areas.

In order to achieve the desired color filter material patterning, the surface energy of the substrate must be selectively modified. It is important that the surface energy be capable of being modified with high resolution (i.e., so that the surface energy characteristics can change over very short distances), and also the modification of surface energy characteristics must alternate with dispensing/drying of color filter material such that regions of (say) red (R), green (G), and blue (B) materials can be patterned immediately adjacent each other. The necessary high resolution patterning can be accomplished using lasers to modify the surface energy characteristics; lasers can pattern at very high resolutions and repeatably pattern large areas. Also, when the substrate used in the SM process includes a backplane, lasers can readily be controlled by reference either to electrodes themselves or to fiducial marks on the backplane to effect the necessary alignment of the color filter materials with the sub-pixel electrodes. Coating materials are known that can be turned from hydrophobic to hydrophilic by exposure to laser light, either by changing the chemistry of the coating or by destroying a hydrophobic coating on a hydrophilic surface. In general, it is preferred for environmental reasons to use aqueous color filter materials, which require hydrophilic areas on which to be deposited, but obviously if solvent-based color filter materials are to be used, it will be necessary to use a hydrophilic coating which can be converted to a hydrophobic form.

Figure 3A:
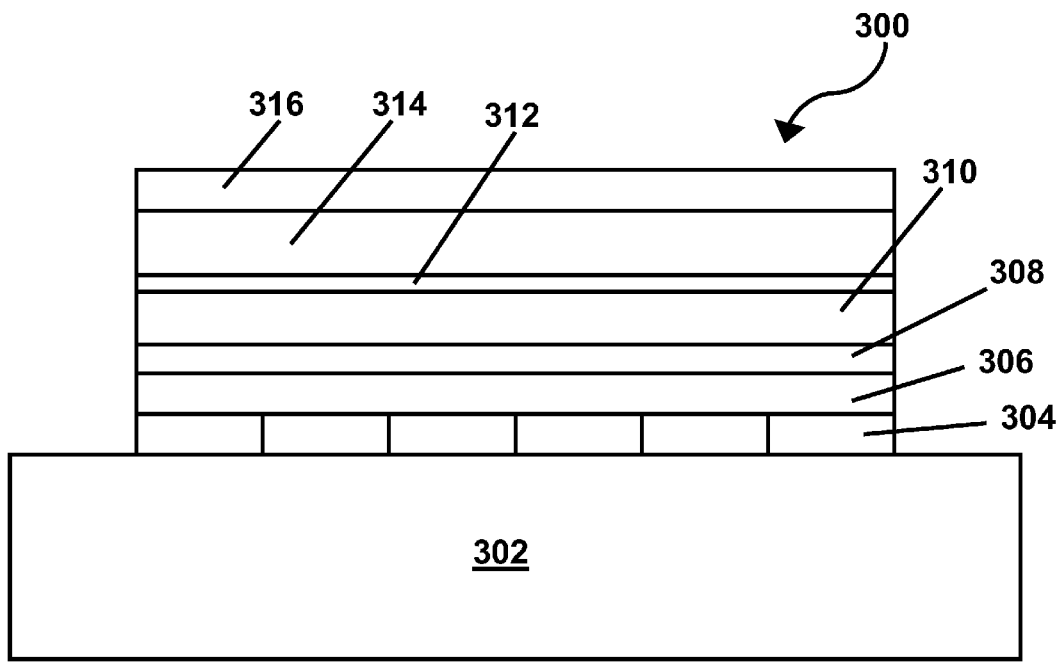
FIGS. 3A to 3E are schematic side elevations of various stages of a second surface modification process of the present invention.
Figure 3B:
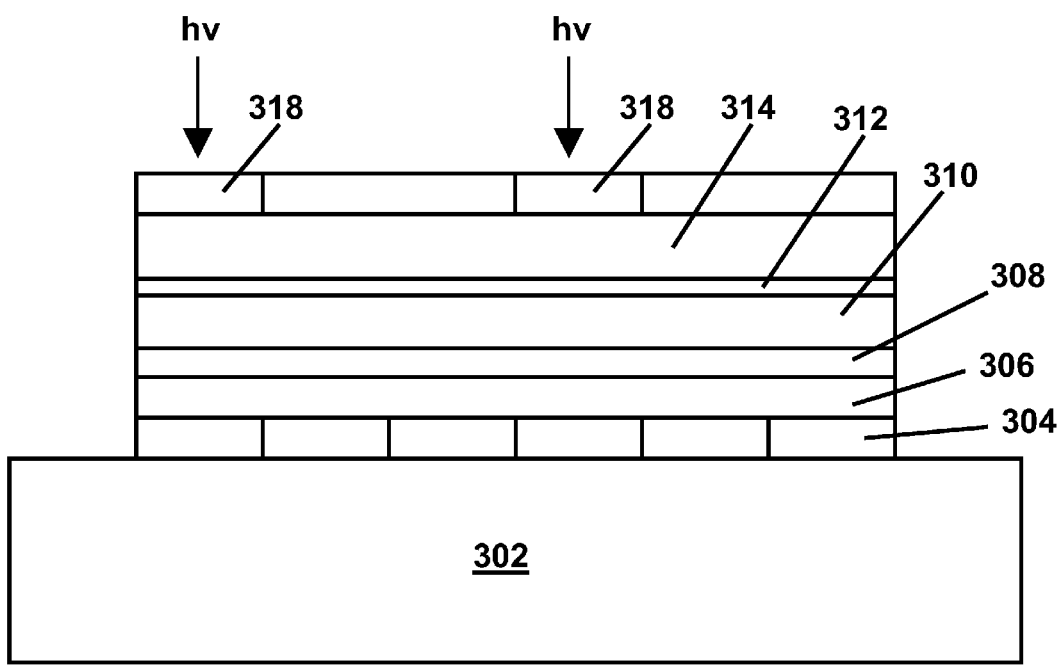
Figure 3C:
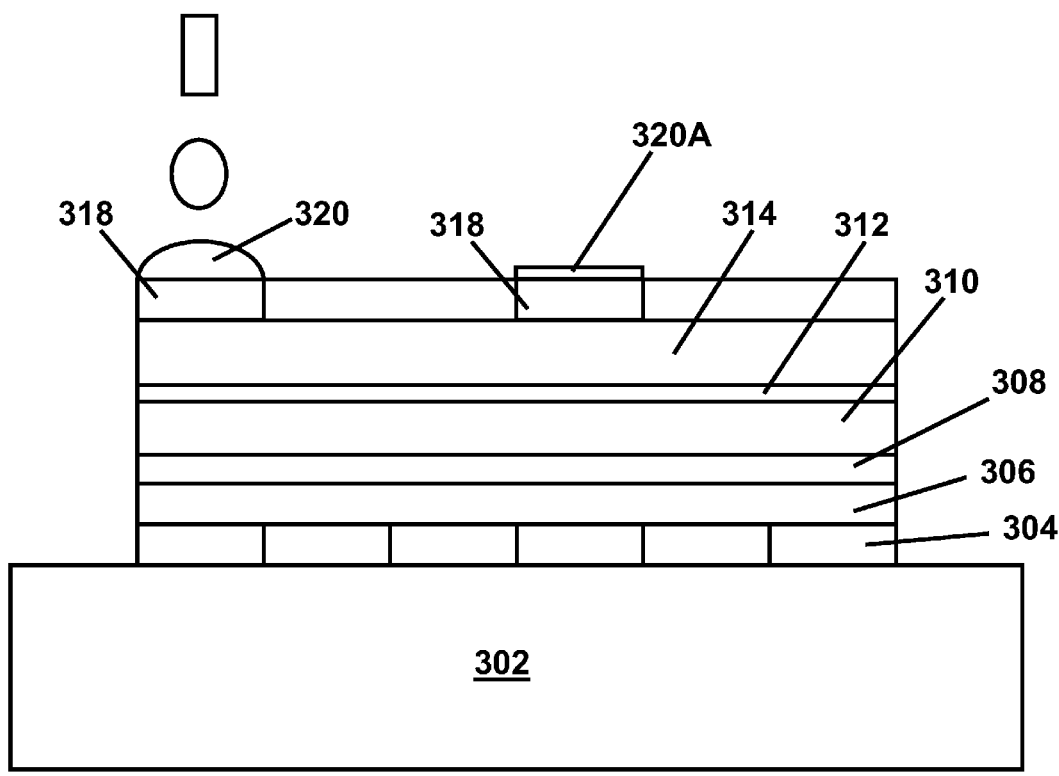

A preferred surface modification process of the present invention will now be described with reference to FIGS. 3A to 3E of the accompanying drawings. As shown in FIG. 3A, the process begins with a substrate (generally designated 300) which is in the form of a complete monochrome display comprising a backplane 302 bearing (in order) sub-pixel electrodes 304, a rear adhesive layer 306, a layer 308 of electro-optic medium, a front adhesive layer 310, a light-transmissive electrode layer 312, and a protective layer 314. The exposed surface (the top surface as illustrated in FIG. 3A) of protective layer 314 is coated with a hydrophobic surface treatment 316 that can be converted to a hydrophilic form by exposure to laser radiation. In the first step of the process, the coating 316 is imagewise exposed to laser radiation to convert areas 318 (FIG. 3B) of the coating to the hydrophilic form. (For ease of illustration, FIGS. 3B to 3E show the deposition of the various color filter materials in the form of stripes extending perpendicular to the plane of the Figures, but of course other arrangements of the color filter materials can be used in desired. In particular, RGBW and CMYW sub-pixels may often be arranged in 2×2 arrangements of sub-pixels to form single pixels.) Next, as illustrated in FIG. 3C, a controlled amount of a first color filter material 320 (say, a red color filter material) is dispensed in liquid form on to each of the hydrophilic areas 318. Since each drop of the red material 320 wets the hydrophilic area 318 on to which it is dispensed, the red material 320 spreads across the entire hydrophilic area 318, but since the remaining parts of the coating 316 remain hydrophobic, the red material 320 cannot spread beyond the edges of the hydrophilic area 318. The red material 320 is then dried or otherwise cured to form a dried red layer 320A completely covering each area 318.

Figure 3D:
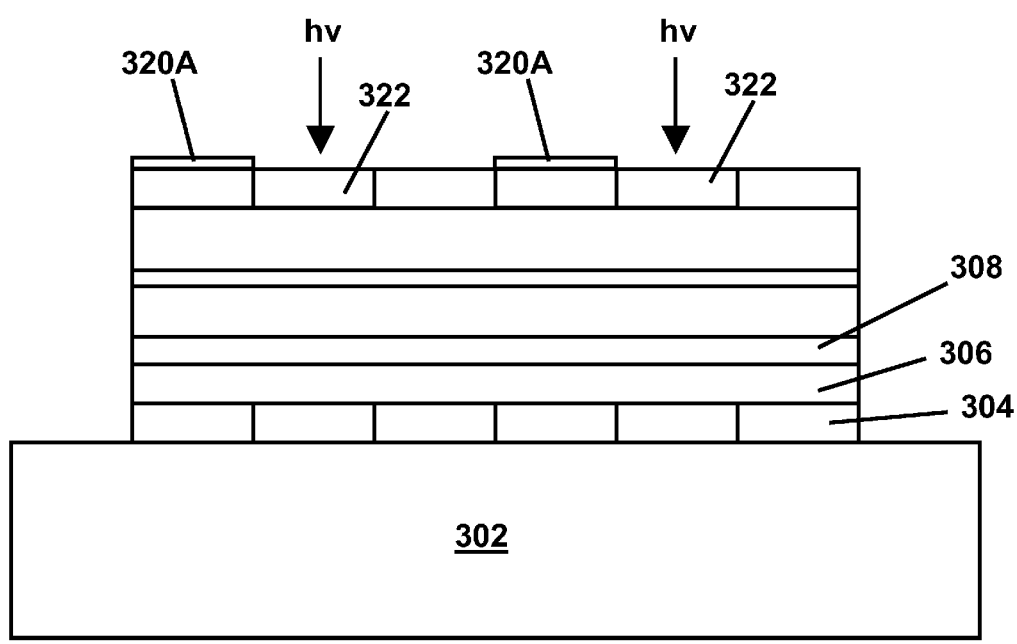
Figure 3E:
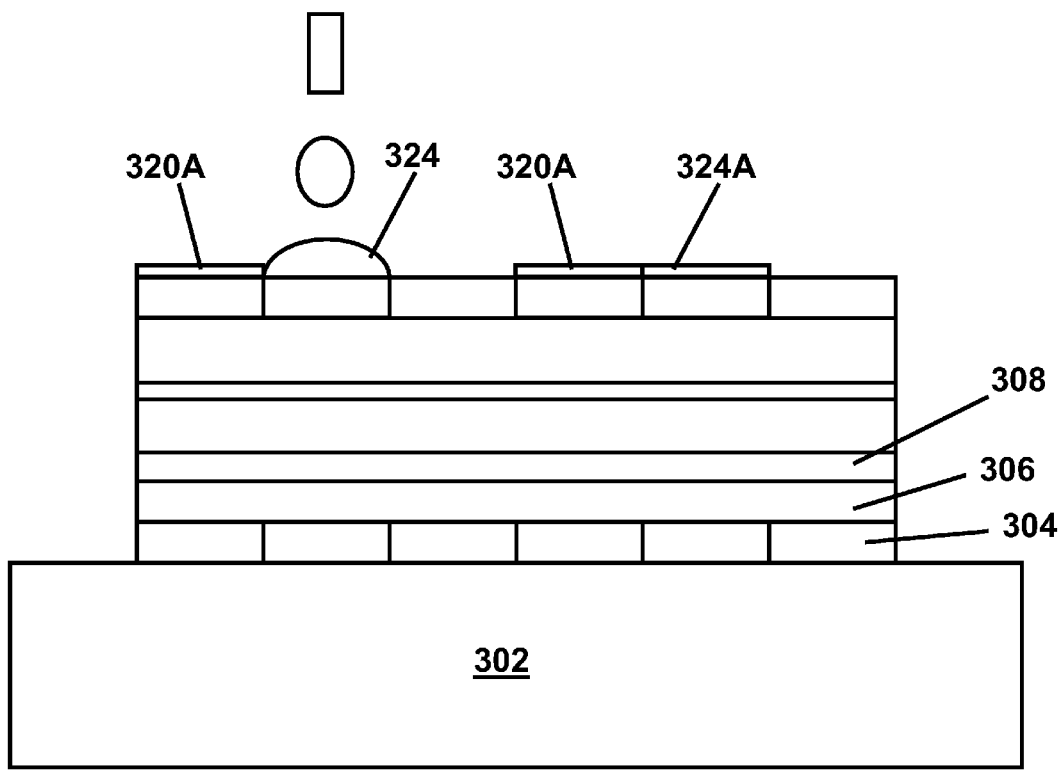

The laser radiation is then again applied, as indicated in FIG. 3D to convert areas 322 of the coating 316 (the areas 322 lying adjacent the coated areas 318) to the hydrophilic form, and then a second color filter material 324 (say, a green color filter material—see FIG. 3D) is dispensed in liquid form on to each of the hydrophilic areas 322, and dried or otherwise cured to form a dried green layer 324A completely covering each area 322 (FIG. 3E). Note that the green material 324 is strictly confined to areas 322 by, on the one hand, the remaining hydrophobic areas of the coating 316 and, on the other hand, the dried red layer 320A produced in the earlier step.

Although not shown in FIGS. 3A to 3E, the last step of the process is the use of laser radiation to convert the remaining areas of the coating 316 to their hydrophilic form, and the dispensing and drying of a third color filter material (say a blue color filter material) on the areas of the substrate not covered by the dried red and green layers 320A and 324A respectively. Note that, in this step of the process, the spreading of the blue color filter material is controlled on both sides by the previously formed dried red and green layers 320A and 324A.

Several characteristics are critical to forming a color filter material pattern with high resolution. The viscosity and uniformity of the flowable material dispensed must allow dispensing without clogging any nozzle (for example, an ink jet or micro-pipette nozzle) used for the dispensing. To create droplets of reproducible size, the surface energy of the substrate must be controlled to allow droplets to "snap off" correctly, i.e., be accurately confined to the desired areas of the substrate. Drying and/or curing must be complete enough that subsequent wet coatings do not disturb the patterning of previous layers; such non-disturbance can be enhanced by curing the color filter material layers between dispensing steps.

Once the desired pattern of color filter materials is complete, an adhesive can be coated or laminated over the color filter materials to allow the materials to be adhered to another component of the final display, for example a protective sheet.

As already indicated, the SM process of the present invention can be used in various ways in the manufacture of a finished electro-optic display. It is presently preferred that the color filter materials be coated directly on to a monochrome display as illustrated in FIGS. 3A-3E, this display typically being formed by laminating a front plane laminate to a backplane, which can be rigid or flexible. This gives the highest display resolution, and has the advantage that any necessary ultra-violet filter layers, barriers and edge seals can be in place and inspected before the color filter array is added, thus providing a very practical method for creating a color display from an existing monochrome display. A thin front substrate can be used to reduce parallax between the color filter array and the electro-optic medium. Accurate alignment of the various areas of color filter material with the sub-pixel electrodes on the backplane can be achieved by providing the backplane with fiducial marks which can be detected and used to control the application of the laser radiation, thus avoiding any further alignment steps. Alternatively, as already discussed, the SM process can be carried out using as a substrate a light-transmissive electrode layer (for example, the substrate can be a front plane laminate not yet laminated to a backplane) or a release sheet. If the SM process is carried out on a light-transmissive electrode layer, an electro-optic medium and a lamination adhesive layer can be laminated over the electrode layer to form a "classic" front plane laminate, as described in the aforementioned U.S. Pat. No. 6,982,178. If the SM process is carried out on a release sheet, an electro-optic medium may be coated over the color filter array, or a lamination adhesive layer can be laminated over the color filter array and the release sheet/color filter array sub-assembly thus converted to a front plane laminate, double release sheet or inverted front plane laminate. When the resulting structure is subsequently laminated to a backplane, the lamination should of course be effected to that the areas of the various color filter materials are accurately aligned with the sub-pixel electrodes of the backplane.

The SM process can achieve very high resolution (of the order of microns), which is compatible with high resolution commercial TFT backplanes. The SM method is additive (i.e., all the color filter material applied ends up in the final display, no stripping of applied color filter material being required), thus making maximum use of color filter material. The laser patterning used in the SM process can be used to compensate for distortions common in large plastic substrates, thus allowing high resolution patterning over such large substrates. Furthermore, laser patterning is relatively inexpensive, can accommodate a wide range of sizes of substrates, and (since the patterning is software controlled) allows design changes to be implemented quickly. Finally, laser patterning can be used with inexpensive, room temperature processable substrates, for example poly(ethylene terephthalate).

Part B: Donor Sheet Transfer Process

The donor sheet transfer process of the present invention uses radiation to transfer selected areas of a layer of color filter material on a donor sheet to a substrate by imagewise application of radiation to the donor sheet. Typically, the donor sheet will comprise a radiation absorbing coating, which may expand or vaporize in any known manner to detach the color filter material from the donor sheet. A separate donor sheet is used for each color filter material to be deposited on the substrate. The process allows for deposition of a small area of color filter material in a precise location and deposition of a precisely controlled thickness of color filter material.

Figure 4A:
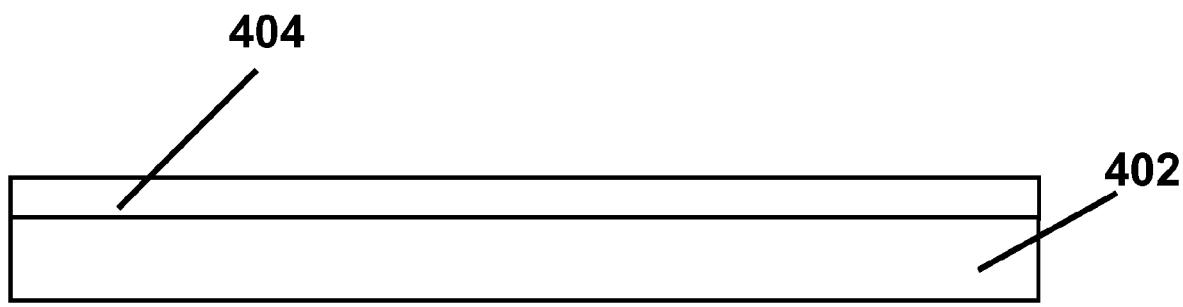
FIGS. 4A to 4C are schematic side elevations of various stages of a donor sheet transfer process of the present invention.
Figure 4B:
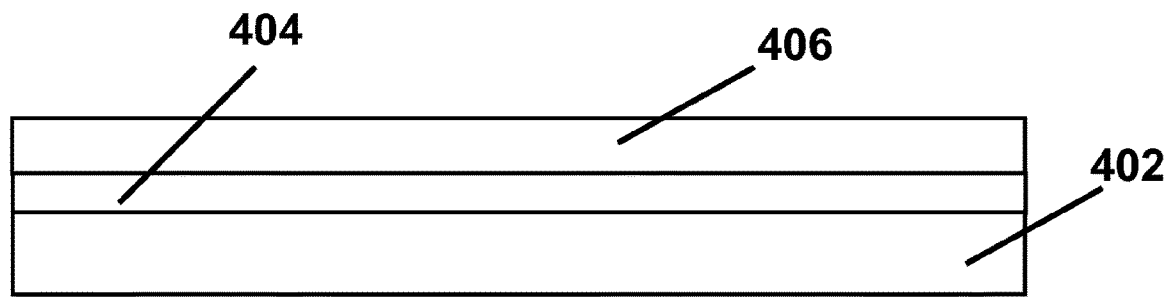

A preferred DST process of the present invention will now be described with reference to FIGS. 4A to 4C. As shown in FIG. 4A, the first step of the process is the creation of a donor sheet by applying to a carrier 402 a coating 404 capable of absorbing laser radiation. For example, a laser having a wavelength of about 800 nm may be used and the coating 404 optimized to absorb this wavelength. Next, as shown in FIG. 4B, a uniform coating 406 of the color filter material is coated over the radiation-absorbing coating 404. The color filter material coating 406 may be deposited in liquid or flowable form and subsequently dried or cured to provide a mechanically coherent layer of color filter material on the radiation-absorbing coating 404. If desired, a thin layer of adhesive can be coated over the radiation-absorbing coating 404 to improve the adhesion of the color filter material coating 406 to the coating 404. The completed donor sheet shown in FIG. 4B is now ready for use.

Figure 4C:
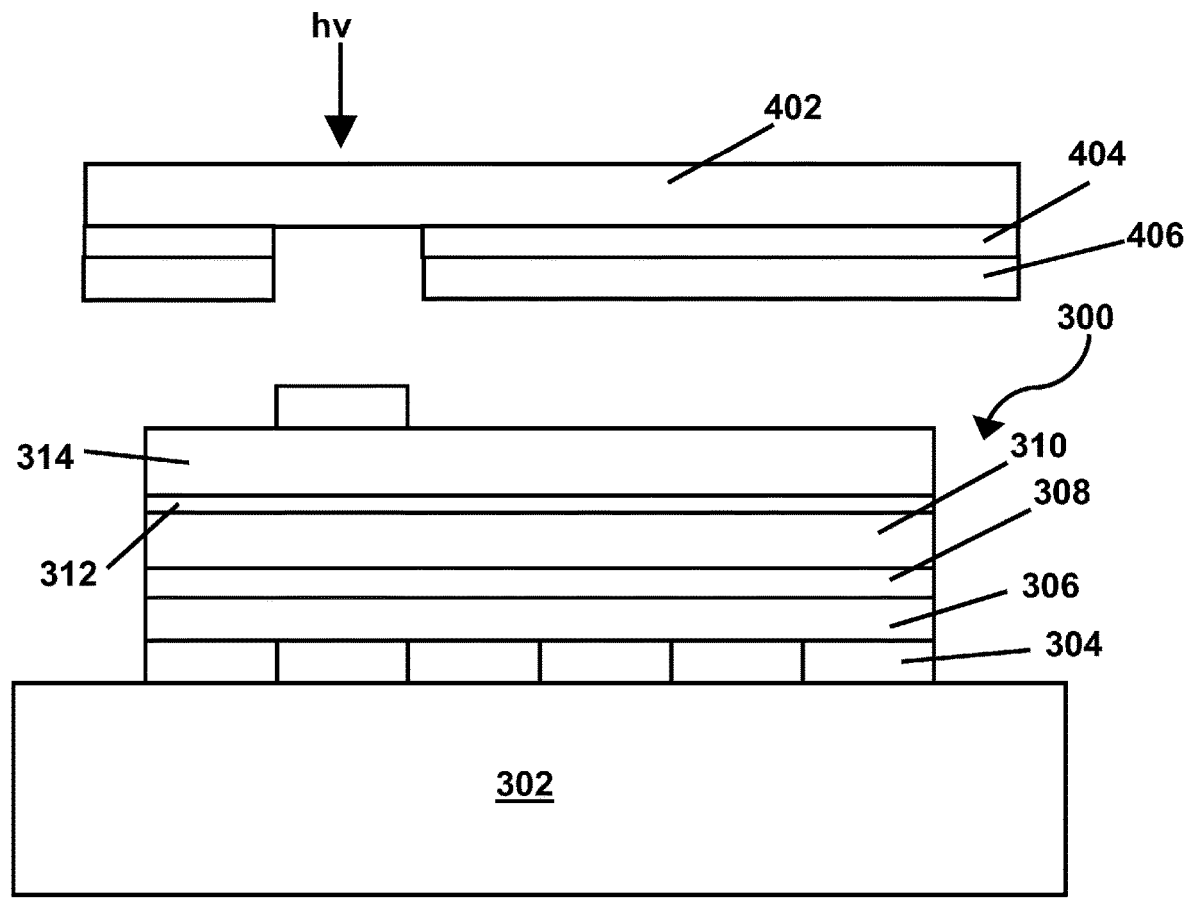

Next, as shown in FIG. 4C, the donor sheet is brought adjacent a substrate 300, with the color filter material layer 406 facing the substrate 300. (FIG. 4C shows the DST process being used with the same substrate 300 as shown in FIG. 3A, except that the coating 316 is not present since it is not needed in the DST process, and this substrate has already been described in detail in Part A above.) A very short pulse (typically of the order of picoseconds) of laser radiation is applied imagewise through the carrier 402 (which must of course be substantially transmissive of the radiation used), and is absorbed in the coating 404, causing this coating to expand and/or vaporize and/or chemically decompose to sever an area of the color filter material from the coating 406 and cause this area of color filter material to adhere to the protective layer 314 of substrate 300. (For ease of illustration, FIG. 4C shows a small gap between the donor sheet and the substrate. In practice, the two sheets are normally in contact with one another during the DST process.) The surface of the substrate 300 on which the color filter material is deposited may of course optionally be treated with a coating to improve the adhesion of the color filter material thereto. Alignment of the color filter material with the sub-pixel electrodes of the substrate may be effected by providing fiducial marks on the substrate and using these marks to control the laser applied to the donor sheet, as described above.

At this point, only one color filter material has been applied to the substrate 300. To produce a full color display, the step of FIG. 4C is repeated with two or more additional donor sheets to place additional color filter materials on the substrate 300, thus providing a full color electro-optic array of sub-pixels on the substrate 300.

Once the desired pattern of color filter materials on the substrate is complete, an adhesive can be coated or laminated over the color filter materials to allow the materials to be adhered to another component of the final display, for example an electro-optic medium layer.

As already indicated, the DST process of the present invention can be used in various ways in the manufacture of a finished electro-optic display. It is presently preferred that the color filter materials be deposited directly on to a monochrome display, as illustrated in FIGS. 4A-4C, this display typically being formed by laminating a front plane laminate to a backplane, which can be rigid or flexible. This gives the highest display resolution, and has the advantage that any ultra-violet filter layers, barriers and edge seals can be in place and inspected before the color filter array is added, thus providing a very practical method for creating a color display from an existing monochrome display. A thin front substrate can be used to reduce parallax between the color filter array and the electro-optic medium. Accurate alignment of the various areas of color filter material with the sub-pixel electrodes on the backplane can be achieved by providing the backplane with fiducial marks which can be detected and used to control the application of the laser radiation, thus avoiding any further alignment steps. Alternatively, as already discussed, the DST process can be carried out using as a substrate a light-transmissive electrode layer (for example, the substrate can be a front plane laminate not yet laminated to a backplane) or a release sheet. If the DST process is carried out on a light-transmissive electrode layer, an electro-optic medium and a lamination adhesive layer can be laminated over the electrode layer to form a "classic" front plane laminate, as described in the aforementioned U.S. Pat. No. 6,982,178. If the DST process is carried out on a release sheet, an electro-optic medium may be coated over the color filter array, or a lamination adhesive layer can be laminated over the color filter array and the release sheet/color array sub-assembly thus converted to a front plane laminate, double release sheet or inverted front plane laminate. When the resulting structure is subsequently laminated to a backplane, the lamination should of course be effected to that the areas of the various color filter materials are accurately aligned with the sub-pixel electrodes of the backplane.

The DST process can achieve very high resolution (of the order of microns), which is compatible with high resolution commercial TFT backplanes. The uniformity of the color filter materials layer in the final display is controlled by the uniformity of the layer of color filter material on the donor sheet, and the donor sheet can be chosen to maximize such coating uniformity. The transfer of the color filter material from the donor sheet is a "dry" process, so no subsequent drying or curing step is required; there need be no period during which the deposited color filter material is tacky and could become contaminated by dust etc. sticking to a tacky layer, and there is no possibility of deposition of liquid or flowable material disturbing previously-deposited color filter material. The radiation absorbing layer used in the preferred DST process described above minimizes energy transfer to the color filter material and to any electro-optic medium present in the substrate and thus minimizes possible radiation damage to these materials. The laser patterning used in the DST process can be used to compensate for distortions common in large plastic substrates, thus allowing high resolution patterning over such large substrates. Furthermore, laser patterning is relatively inexpensive, can accommodate a wide range of sizes of substrates, and (since the patterning is software controlled) allows design changes to be implemented quickly. Finally, laser patterning can be used with inexpensive, room temperature processable substrates, for example poly(ethylene terephthalate).

Part C: Flexographic Process

The flexographic process of the present invention essentially modifies known flexographic printing technology to apply multiple types of color filter material to form a color electro-optic display.

Flexographic printing is commonly used to create high quality color prints requiring registration of multiple colored ink layers (typically cyan, magenta, yellow, and black); the process inherently has high resolution of the order of microns to tens of microns. The basic process is shown in FIG. 5.

As shown in that Figure, in the flexographic process of the present invention the image to be printed (for example, an array of red color filter elements) is created on a patterned plate cylinder 502 having raised and recessed areas. A fluid film 504 of the appropriate color filter material (for example, a mixture of a red dye and a liquid polymer or oligomer) is picked up from a pan 506 by a fountain roll 508 and transferred in a thin layer to an Anilox roll 510. The Anilox roll 510 in turn transfers the thin, uniform layer of color filter material to the plate cylinder 502 such that the liquid material 504 is transferred only to the raised areas of the plate cylinder. A web of substrate 512 passes between an impression cylinder 514 and the plate cylinder 502 and the color filter material 504 is transferred from the raised areas of plate cylinder 502 to the substrate 512.

Figure 5:
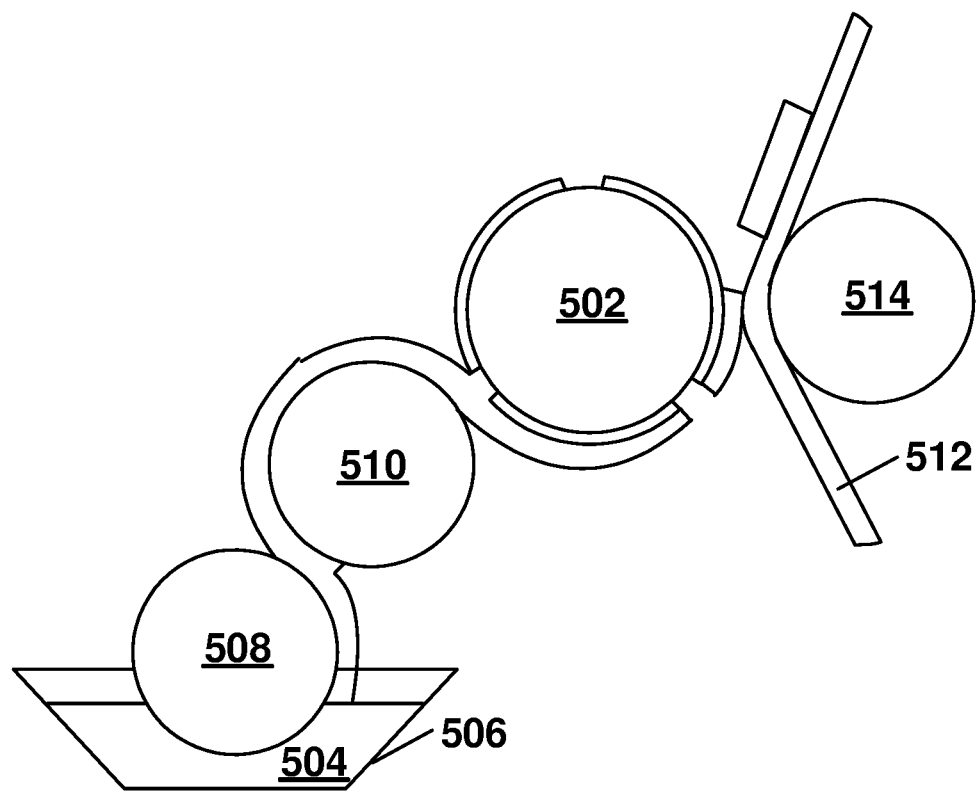
FIG. 5 is a schematic elevation of a flexographic process of the present invention.

A single station, as shown in FIG. 5, prints only a single colored ink or a single color filter material. The substrate 512 passes through a sequence of such stations, which each apply an additional color filter material of a differing color in registry with the pattern previously printed on the substrate. Several commercial variations of flexographic printing exist, including one in which the liquid to be printed is doctor bladed on the Anilox roll 510 to achieve a more uniform coating.

Several characteristics of the liquid being printed are critical to making a print with high resolution. Depending on the process characteristics, viscosity values of 10-10,000 cP can be used, though a viscosity of the order of thousands of centipoise is commonly used. Other rheological properties (shear thickening/thinning) may also be important. Wetting of the substrate by the liquid being printed must be controlled such that a sub-pixel does not bleed into an adjacent sub-pixel area. To achieve this, the surface energy of the printed material and the substrate must be matched, and any necessary adjustments can be made by adding surfactant to the printing liquid or by pre-treating the substrate to accept the liquid. Drying or curing of the printed liquid must be sufficiently complete that subsequently printed liquids do not disturb previously printed materials; this is a function of printing speed and imprint load. The liquid printed can be water or solvent based, though some solvent in the mixture is preferred to increase drying speed. The printed liquid can be cured thermally or with ultra-violet radiation to prevent subsequent printing from disturbing previously printed materials.

Once the desired pattern of color filter materials is complete, an adhesive can be coated or laminated over the color filter materials to allow the coated substrate to be adhered to another component of the final display, for example a layer of electro-optic medium.

Figure 6:
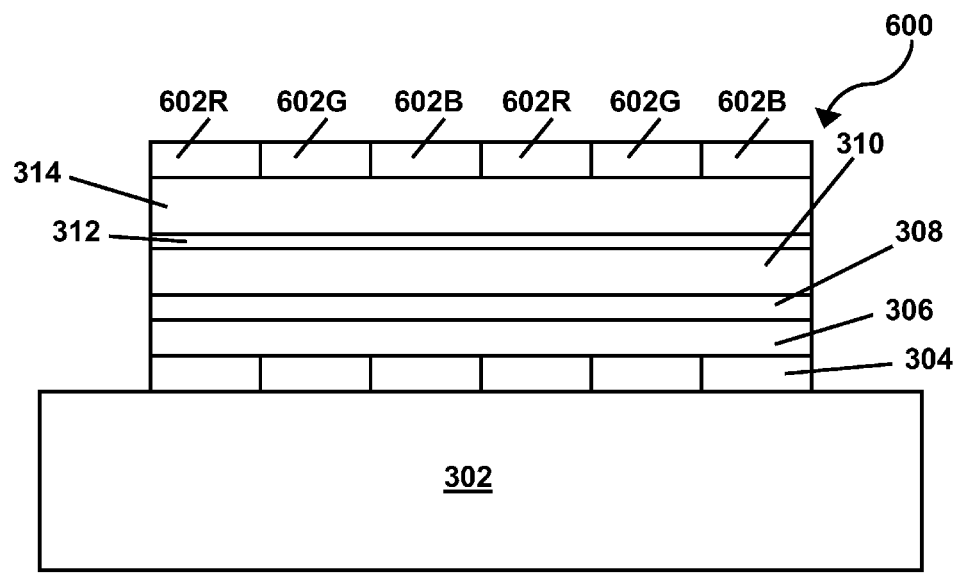
FIG. 6 shows a preferred display structure of the invention.

As already indicated, the flexographic process of the present invention can be used in various ways in the manufacture of a finished electro-optic display. A preferred display structure (generally designed 600) is shown in FIG. 6 of the accompanying drawings. This Figure shows a color filter array comprising red, green and blue areas 602R, 602G and 602B respectively formed on a substrate comprising the same layers as the substrate 300 as described above, except that the layer 316 is omitted. The color display 600 is formed by flexographic printing of the red, green and blue areas 602R, 602G and 602B directly on to the protective layer 314 of substrate 300 in alignment with sub-pixel electrodes 304R, 304G and 304B respectively. The protective layer 314 is kept thin to reduce parallax between the color filter array and the electro-optic medium 308. The color filter materials are printed directly on to the substrate, which may be in the form of a continuous flexible web or (for example) in the form of a flat glass plate which can be translated under a plate cylinder synchronously with the rotation of the plate cylinder. Accurate alignment of the various areas of color filter materials with the sub-pixel electrodes can be achieved by providing the substrate with fiducial marks which can be detected and used to control the printing process. Alternatively, as already discussed, the flexographic process can be carried out using as a substrate a light-transmissive electrode layer or a release sheet. If the flexographic process is carried out on a light-transmissive electrode layer, an electro-optic medium and a lamination adhesive layer can be laminated over the electrode layer to form a "classic" front plane laminate, as described in the aforementioned U.S. Pat. No. 6,982,178. If the flexographic process is carried out on a release sheet, an electro-optic medium may be coated over the color filter array, or a lamination adhesive layer can be laminated over the color filter array, and the release sheet/color filter array sub-assembly thus converted to a front plane laminate, double release film or inverted front plane laminate. When the resulting structure is subsequently laminated to a backplane, the lamination should of course be effected so that the areas of the various color filter materials are accurately aligned with the sub-pixel electrodes of the backplane.

The flexographic process can achieve very high resolution (of the order of microns), which is compatible with high resolution commercial TFT backplanes. The flexographic method is additive (i.e., all the color filter material applied ends up in the final display, no stripping of applied color filter material being required), thus making maximum use of color filter materials. The investment cost for flexographic printing is commercially reasonable (about US$1 million for a high end four color apparatus), and considerable smaller than the investment required for other high resolution patterning methods such as photolithography. This low investment cost is especially reasonable in view of the high throughput of flexographic printing apparatus, which typically runs at about 100-200 feet per minute (about 30-60 meters per minute) and is thus very economical for high volume production Finally, the flexographic process can be used with inexpensive, room temperature processable substrates, for example poly(ethylene terephthalate).

Numerous changes and modifications can be made in the preferred embodiments of the present invention already described without departing from the scope of the invention. Accordingly, the foregoing description is to be construed in an illustrative and not in a limitative sense.

The invention claimed is:

1. A process for the production of an electro-optic display with a color filter comprising:
   providing a first donor sheet comprising a first color material contacting a radiation absorbing layer, the first color material and the radiation absorbing layers comprising different materials;
   bringing the first donor sheet adjacent a substrate with the first color filter material facing the substrate;
   irradiating the radiation absorbing layer thereby causing the radiation absorbing layer to expand or vaporize or chemically decompose to remove a portion of the radiation absorbing layer thereby causing a first area of the first color filter material to become detached from the first donor sheet;
   depositing the first area of the first color filter material onto the substrate, the first area of the first color filter material having a shape similar to the removed portion of the radiation absorbing layer; and
   providing a second donor sheet comprising a second color material contacting a second radiation absorbing layer;
   bringing the second donor sheet adjacent the substrate with the second color filter material facing the substrate; and
   irradiating a second area of the second donor sheet, thereby causing the second area of the second color filter material to become detached from the second donor sheet and deposited on the substrate.

2. A process according to claim 1 wherein the first color filter material on the first donor sheet has a color substantially the same as the first area of the substrate.

3. A process according to claim 1 wherein the first color filter material on the first donor sheet contains a color precursor which is treated to form a colored material on the substrate.

4. A process according to claim 3 wherein the color precursor is a thermally or radiation activated dye precursor which is converted to a colored material during the application of radiation to the first color filter material during its transfer to the substrate.

* * * * *